(12) United States Patent
Lam

(10) Patent No.: US 11,112,483 B2
(45) Date of Patent: Sep. 7, 2021

(54) DETERMINATION SYSTEM FOR THE DIRECTION OF ARRIVAL OF A SIGNAL AND FOR ELECTRONIC ATTACK

(71) Applicant: Lockheed Martin Corporation, Bethesda, MD (US)

(72) Inventor: Tommy Lam, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 303 days.

(21) Appl. No.: 16/325,442

(22) PCT Filed: Aug. 15, 2017

(86) PCT No.: PCT/US2017/046896
§ 371 (c)(1),
(2) Date: Feb. 14, 2019

(87) PCT Pub. No.: WO2018/035097
PCT Pub. Date: Feb. 22, 2018

(65) Prior Publication Data
US 2019/0212408 A1    Jul. 11, 2019

Related U.S. Application Data

(60) Provisional application No. 62/375,608, filed on Aug. 16, 2016.

(51) Int. Cl.
*G01S 3/16* (2006.01)
*H03M 7/30* (2006.01)
(Continued)

(52) U.S. Cl.
CPC ............... *G01S 3/16* (2013.01); *G01S 3/043* (2013.01); *G01S 3/38* (2013.01); *H03M 7/3062* (2013.01)

(58) Field of Classification Search
CPC ... G01S 1/02; G01S 3/16; G01S 3/043; G01S 3/38; G01S 3/42; G01S 3/58; G01S 3/52; G01S 7/22; H03M 7/3062
(Continued)

(56) References Cited

U.S. PATENT DOCUMENTS 8,306,786 B1    11/2012  Lynch et al.
8,526,550 B1 *   9/2013  Lam ..................... H04B 7/0857
                                                         375/346
(Continued)

OTHER PUBLICATIONS

International Search Report and Written Opinion for International Application No. PCT/US2017/046896 dated Nov. 16, 2017.
(Continued)

*Primary Examiner* — Harry K Liu
(74) *Attorney, Agent, or Firm* — Baker Botts L.L.P.

(57) ABSTRACT

An apparatus, method, or computer-readable storage medium encoded with computer-executable instructions that, when executed by a computer, cause the computer to carry out a method for determining one or more directions of arrival of one or more coherent or incoherent signals with a single radio frequency channel. The apparatus may comprise: a plurality of antenna elements (110) configured to determine the one or more coherent or incoherent signals; a plurality of radio frequency switches (120) configured to selectively activate one or more of the plurality of antenna elements; and a radio frequency combiner (140) configured to combine a plurality of radio frequency signals from one or more selectively activated antenna elements of the plurality of antenna elements.

18 Claims, 16 Drawing Sheets

(51) Int. Cl.
    *G01S 3/38*     (2006.01)
    *G01S 3/04*     (2006.01)

(58) Field of Classification Search
    USPC .......................................................... 342/428
    See application file for complete search history.

(56) References Cited

U.S. PATENT DOCUMENTS

| | | | |
|---|---|---|---|
| 2003/0048221 A1* | 3/2003 | Tseng | G01S 19/53 342/357.36 |
| 2008/0303742 A1* | 12/2008 | Dybdal | H01Q 21/0006 343/893 |
| 2011/0199972 A1* | 8/2011 | Warke | H01Q 21/0037 370/328 |
| 2015/0282112 A1* | 10/2015 | Bialer | H04L 45/24 455/456.1 |

OTHER PUBLICATIONS

International Preliminary Report on Patentability for International Application No. PCT/US2017/046896 dated Feb. 28, 2019.
Baraniuk et al., Compressive Radar Imaging. Radar Conference. 2007 IEEE. 6 pages. DOI: 10.1109/RADAR.2007.374203. ISBN: 978-1-4244-0283-0.
Hu et al., Randomized Switched Antenna Array FMCW Radar for Automotive Applications. IEEE Transactions on Vehicular Technology. 2014;63(8):3624-41. DOI: 10.1109/TVT.2014.2308895. ISSN: 0018-9545.

* cited by examiner

Single Channel Phasor

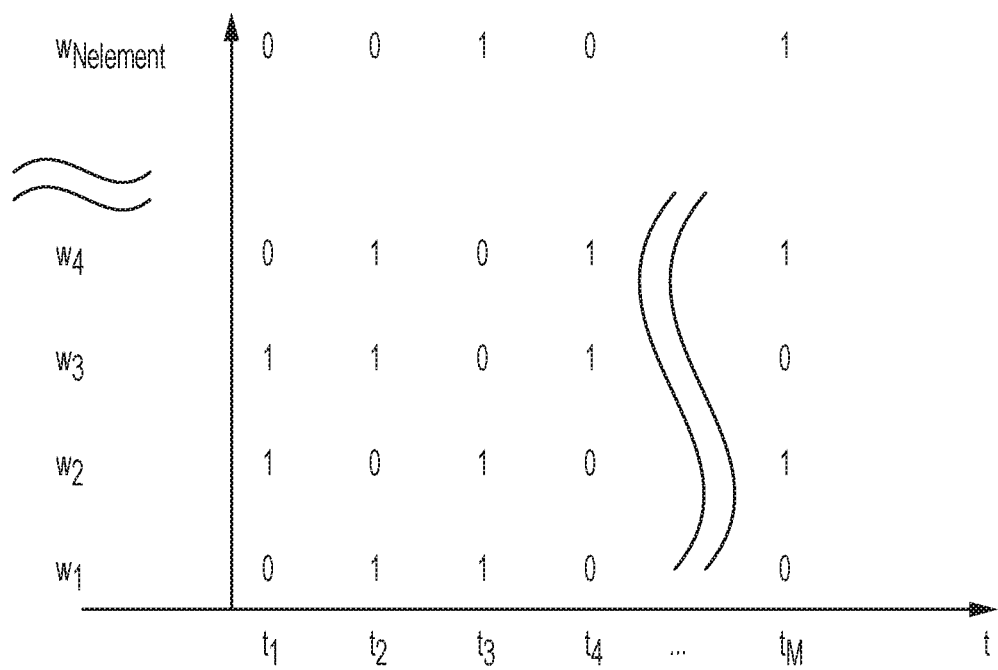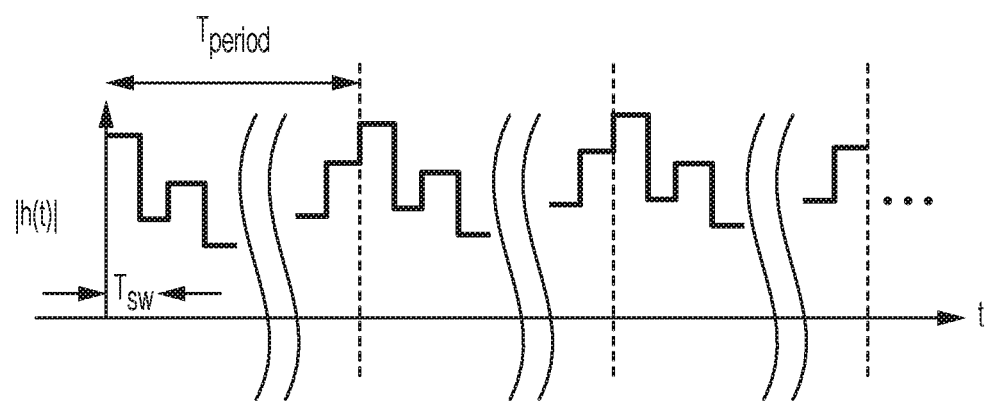
FIG. 5

$$\vec{y}(t) = \vec{w}(t) . \vec{x} . (S_B(t)) e^{j\omega_{RF} t}$$
$$\vec{r}(t) = \vec{h}(t) . (S_B(t)) e^{j\omega_{RF} t} + \overrightarrow{noise(t)}$$

$$\begin{pmatrix} r(t_1) \\ r(t_2) \\ r(t_3) \\ \vdots \\ r(t_{M-1}) \\ r(t_M) \end{pmatrix} = \begin{pmatrix} y(t_1) \\ y(t_2) \\ y(t_3) \\ \vdots \\ y(t_{M-1}) \\ y(t_M) \end{pmatrix} + \begin{pmatrix} n(t_1) \\ n(t_2) \\ n(t_3) \\ \vdots \\ n(t_{M-1}) \\ r(t_M) \end{pmatrix}$$

FIG. 6A w(t) is either 1 or 0 at a given time
    Representing "On" or "Off" state
    Is a vector in sensor elements at a given time
y(t) is the voltage at the combiner ($\sum$) output at a given time
    Is the vector in time
h(t) is channel system response *without $S_{RF}(t)$*
    Is a vector in time
r(t) is the measured voltage at the combiner ($\sum$) output at a given time
    is multiplication of h(t)x$S_{RF}(t)$
    which is convolution of H(f) and $S_{RF}(f)$
    Is a vector in time

FIG. 6B $$r = [A] \quad f + AWGN$$

Measured    Antenna    Unknown     AWGN
data           DOA       Emitters
            Response

FIG. 6C

DETERMINATION SYSTEM FOR THE DIRECTION OF ARRIVAL OF A SIGNAL AND FOR ELECTRONIC ATTACK

RELATED APPLICATIONS

This application is a national stage filing under 35 U.S.C. § 371 of International Application No. PCT/US2017/046896, filed Aug. 15, 2017, entitled "DETERMINATION SYSTEM FOR THE DIRECTION OF ARRIVAL OF A SIGNAL AND FOR ELECTRONIC ATTACK," which claims the benefit under 35 U.S.C. § 119(e) of U.S. Provisional Patent Application Ser. No. 62/375,608, filed on Aug. 16, 2016 and entitled "DETERMINATION SYSTEM FOR THE DIRECTION OF ARRIVAL OF A SIGNAL AND FOR ELECTRONIC ATTACK," each of which is hereby incorporated herein by reference in its entirety.

BACKGROUND

Antenna assemblies are often used on mobile platforms such as airborne platforms (e.g., airplanes, helicopters, and other forms of aircraft) for various purposes. One of these purposes is to determine the direction of arrival (DOA) of one or more signals. This DOA information may be used to find and track the location of a target, and/or to perform electronic attack on a target. DOA information may also be used to determine the location of the determination system itself and/or the receivers of the signal(s).

SUMMARY

Some aspects include an apparatus for determining one or more directions of arrival of one or more coherent or incoherent signals with a single radio frequency channel. The apparatus may comprise: a plurality of antenna elements configured to determine the one or more coherent or incoherent signals; a plurality of radio frequency switches configured to selectively activate one or more of the plurality of antenna elements; and a radio frequency combiner configured to combine a plurality of radio frequency signals from one or more selectively activated antenna elements of the plurality of antenna elements. The apparatus may also comprise at least one radio frequency channel; and at least one processor configured to determine the one or more directions of arrival of the one or more coherent or incoherent signals. The at least one processor may be configured to determine the one or more directions of arrival of the one or more coherent or incoherent signals using compressive sensing and the at least one radio frequency channel.

The plurality of radio frequency switches may be configured to selectively activate the one or more of the plurality of antenna elements based on a pre-determined pseudo-random switching pattern. The one or more selectively activated antenna elements of the plurality of antenna elements may be connected to the radio frequency combiner. Each unactivated antenna element of one or more unactivated antenna elements of the plurality of antenna elements may be connected to an internal load of a radio frequency switch of the plurality of radio frequency switches.

The plurality of antenna elements may have phases grouped by the plurality of radio frequency switches within 90 degrees of an allowable offset phase, which can be compensated by one or more calibrations. The plurality of antenna elements may be arranged in an array of at least one dimension; and the apparatus may be configured to essentially enhance a gain of the array by utilizing area of the array outside the plurality of antenna elements. The plurality of antenna elements may be arranged in an array of at least two dimensions; and the apparatus may be configured to essentially enhance the gain of the array by having phases of the one or more selectively activated antenna elements of the plurality of antenna elements nominally in phase within 90 degrees at a given beam steering angle.

Further aspects include a method for determining one or more directions of arrival of one or more coherent or incoherent signals with a single radio frequency channel. The method may comprise: sensing, using a plurality of antenna elements, the one or more coherent or incoherent signals; selectively activating, using a plurality of radio frequency switches, one or more of the plurality of antenna elements; and combining, using a radio frequency combiner, a plurality of radio frequency signals from one or more selectively activated antenna elements of the plurality of antenna elements.

Additional aspects include at least one computer-readable storage medium encoded with computer-executable instructions that, when executed by a computer, cause the computer to carry out a method for determining one or more directions of arrival of one or more coherent or incoherent signals with a single radio frequency channel. The method may comprise: sensing, using a plurality of antenna elements, the one or more coherent or incoherent signals; selectively activating, using a plurality of radio frequency switches, one or more of the plurality of antenna elements; and combining, using a radio frequency combiner, a plurality of radio frequency signals from one or more selectively activated antenna elements of the plurality of antenna elements.

BRIEF DESCRIPTION OF DRAWINGS

FIG. 5 depicts an exemplary switching pattern and an exemplary channel system response timing diagram, in accordance with some embodiments.

FIGS. 6A, 6B, and 6C depict exemplary mathematical representations of single channel compressive sensing beamforming, in accordance with some embodiments.

DETAILED DESCRIPTION

Figure 1:
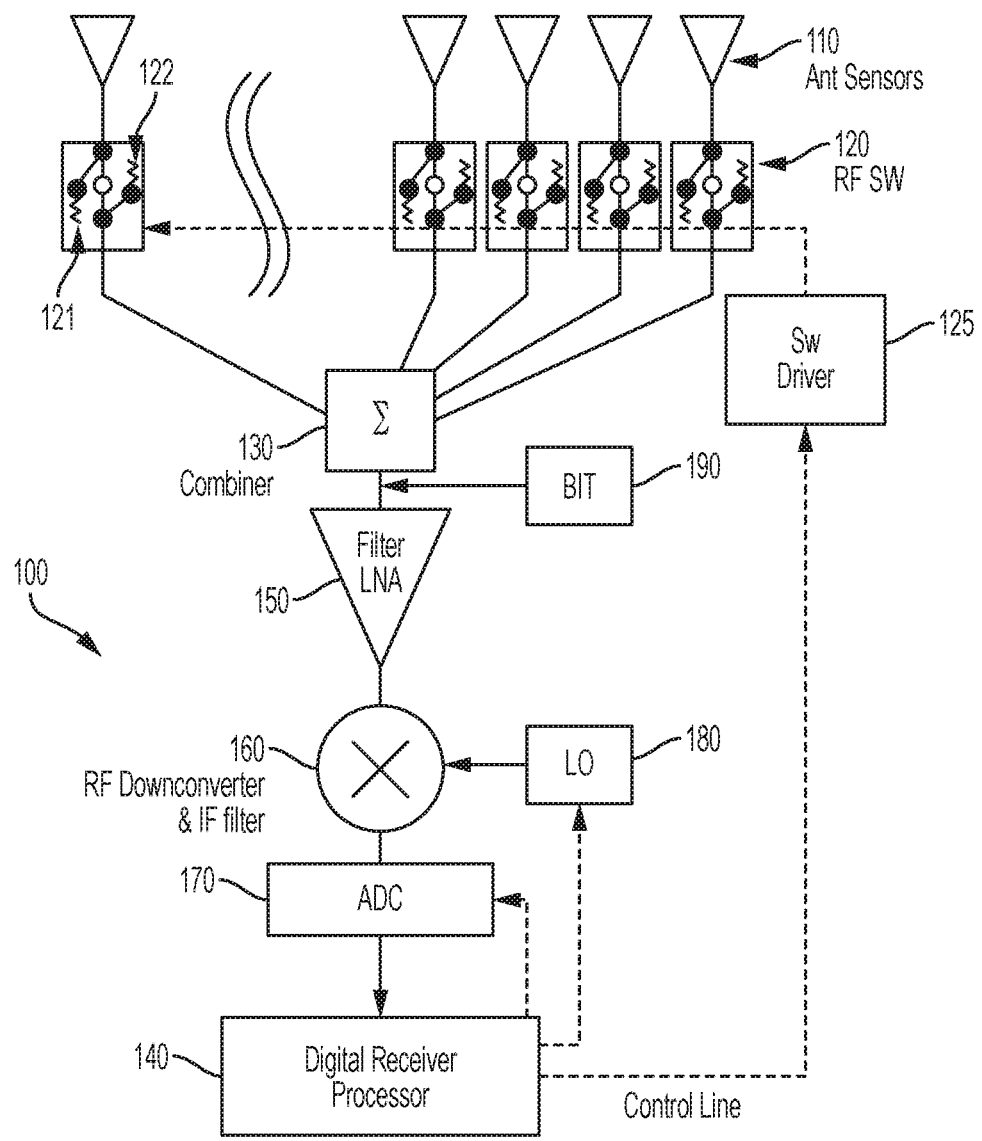
FIG. 1 is a block diagram of an example system for performing determination of the DOA of signal(s) or electronic attack, in accordance with some embodiments.

The inventor has recognized and appreciated that conventional antenna assemblies with discrete frequency band sensors on conventional DOA systems, such as phase interferometers, are not utilizing their full aperture for providing the maximum available antenna gain performance. In other words, their physical area is not fully utilized (i.e., they have poor aperture efficiency because only the discrete sensor apertures within the assembly area are used). The inventor has recognized and appreciated that these conventional assemblies suffer in a number of ways as a result. First, they have less sensitivity performance due to lower gain than they would if they used the full available area. The aperture utilization, hence the maximum achievable gain for frequency independent antennae, is even less than frequency dependent sensors because the frequency independent antennae must maintain the nearly constant gain over all operating frequencies rather than letting their gain increase naturally over frequency.

Accordingly, conventional DOA phase interferometers have lower Signal to Noise Ratio (SNR) due to lower gain and more degraded emitter characterization than a fully utilized aperture system. They also suffer from poorer Cramer Rao Lower Bound (CRLB) DOA estimation variances, which lead to poorer DOA accuracy performance due to potential multi-path errors from obstacles between the emitter(s) and receiver(s) like fuselage or wings of an aircraft, or hills or structures in an outdoor environment. Many conventional discrete sensor antenna assemblies are incapable of resolving coherent multiple-emitter signals such as multi-path errors and their inability to handle co-channel interference. For example, a super resolution DOA system such as Multiple Signal Classification (MUSIC) cannot handle multiple coherent signals reliably. In addition, most affordable conventional DOA antenna assemblies use azimuth sensors only (potentially due to cost constraints), which may result in limited DOA estimation abilities. For example, these affordable assemblies only estimate the DOA of azimuth parameters, but not of elevation or polarization parameters, due to higher cost of a combined azimuth and elevation sensor system design. As such, the inventor has recognized and appreciated that a low cost antenna array architecture is highly desirable to make such multiple parameter capabilities affordable.

Although some ultra-wide band antenna arrays, such as a Tightly Coupled Array (TCA), can provide full aperture utilization over a wide range of frequencies, they require an excessive number of sensors and RF channels, which are high in cost. This is because the TCA design uses nominally half wavelength interelement spacing at the highest frequency to avoid grating lobes. However, this same interelement spacing would become electrically small at the lowest frequency. As a result, the number of sensor elements and RF channels would become unnecessarily oversampled at the lowest frequency by a factor of $F_{high}/F_{low}$. The inventor has recognized and appreciated that it would be desirable to maintain antenna array aperture utilization over a wide range of frequencies without an excessive number of RF channels.

Figure 12:
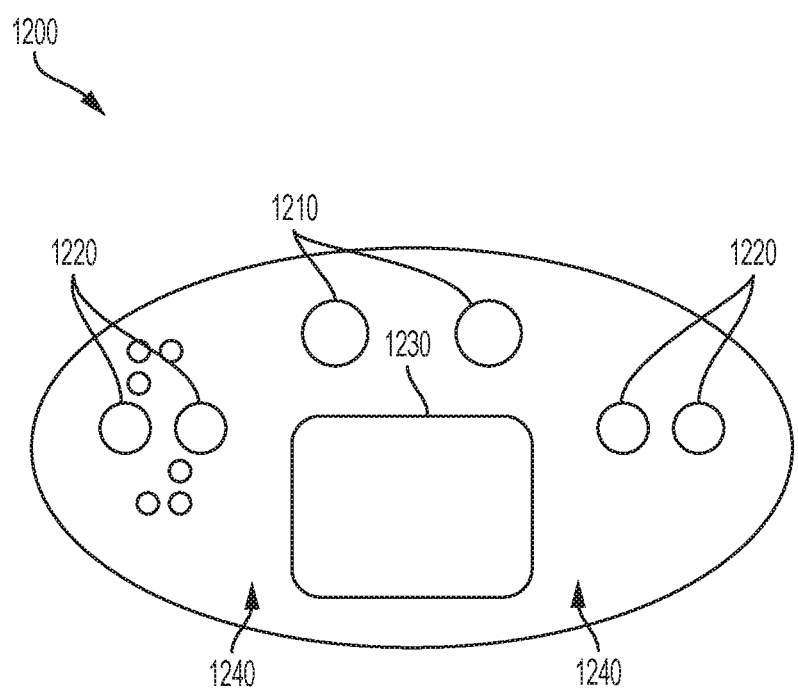
FIG. 12 depicts an exemplary conventional discrete sensor antenna assembly.

FIG. 12 depicts an exemplary conventional discrete sensor antenna assembly. The discrete sensor antenna assembly shown in FIG. 12 includes mid-band sensors 1210, high band sensors 1220, and low band sensor(s) 1230, but a large amount of area 1240 is left unutilized. The inventor has recognized and appreciated that improved sensitivity performance, enhanced overall array gain, and increased aperture efficiency may be attained by reducing or even completely eliminating the unutilized area of antenna assemblies.

The inventor has also recognized and appreciated that a conventional discrete sensor antenna assembly also requires as many interconnect cables as there are radio frequency (RF) channels (between the assembly itself and the receiver), creating a significant weight burden on the platform carrying the assembly.

Figure 13:
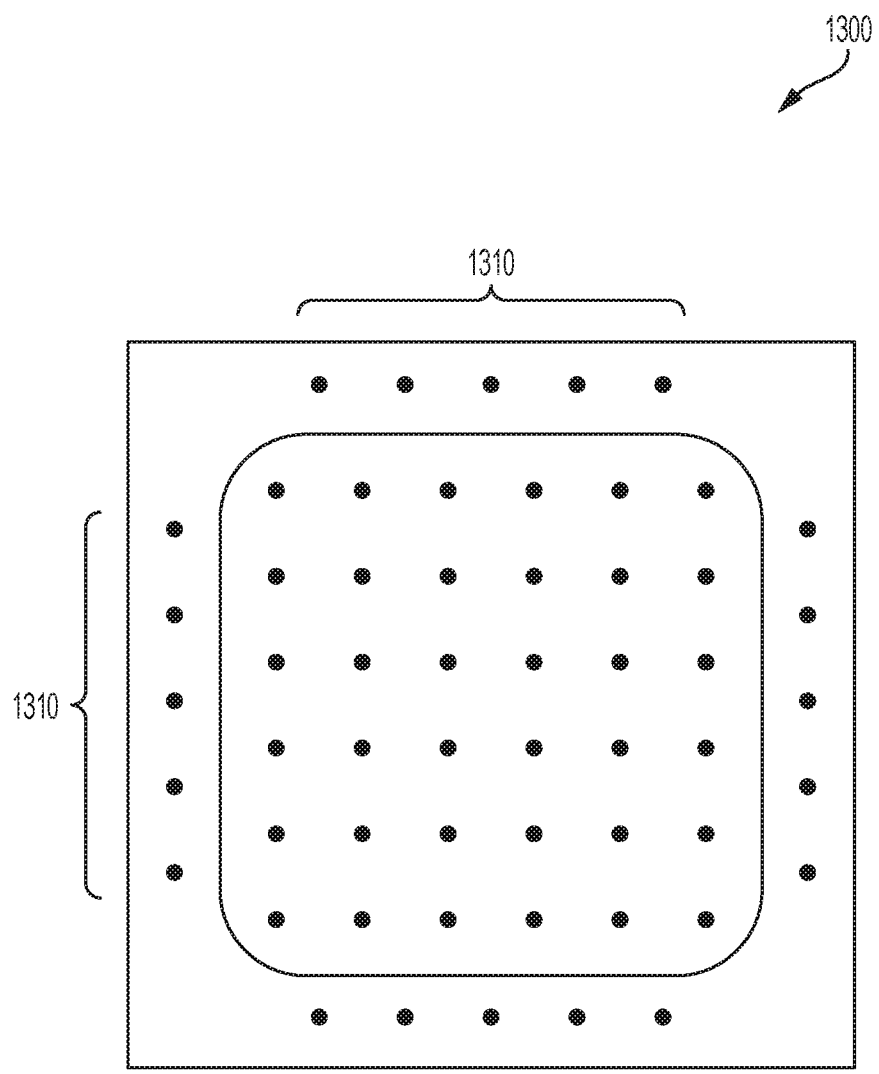
FIG. 13 depicts an exemplary conventional Tightly Coupled Array structure.

Conventional TCA technology has been used to alleviate some of the drawbacks of conventional discrete sensor antenna assemblies. For example, a conventional TCA provides improved aperture efficiency compared to conventional discrete sensor antenna assemblies. FIG. 13 depicts an exemplary conventional TCA structure. As can be seen in FIG. 13, the sensor elements 1310 leave less unused space than is left in the exemplary conventional discrete sensor antenna assembly of FIG. 12. A conventional TCA also has ultra-wide band (UWB) performance, utilizing the full aperture over a wide range of frequencies (e.g., at a ratio of well over 10:1 from the lowest to the highest frequencies, such as 0.5 to 18 GHz). A conventional TCA can provide higher gain, improved sensitivity performance, and higher SNR, which allows a higher probability of signal detection and better CRLB. A conventional TCA can further provide higher emitter characterization accuracy.

However, the inventor has recognized and appreciated that a conventional TCA suffers in its own ways. One of these ways is that a conventional TCA requires excessively numerous and complex RF and digital channels, with each channel represented by a downconverter 1460. This causes high prime power burdens, complex thermal management, and most importantly, poor affordability, especially compared to conventional discrete sensor antenna assemblies, which have less channels and so better affordability. Moreover, each sensor element of a conventional TCA requires its own dedicated RF and digital channel components to make the TCA function.

Figure 14:
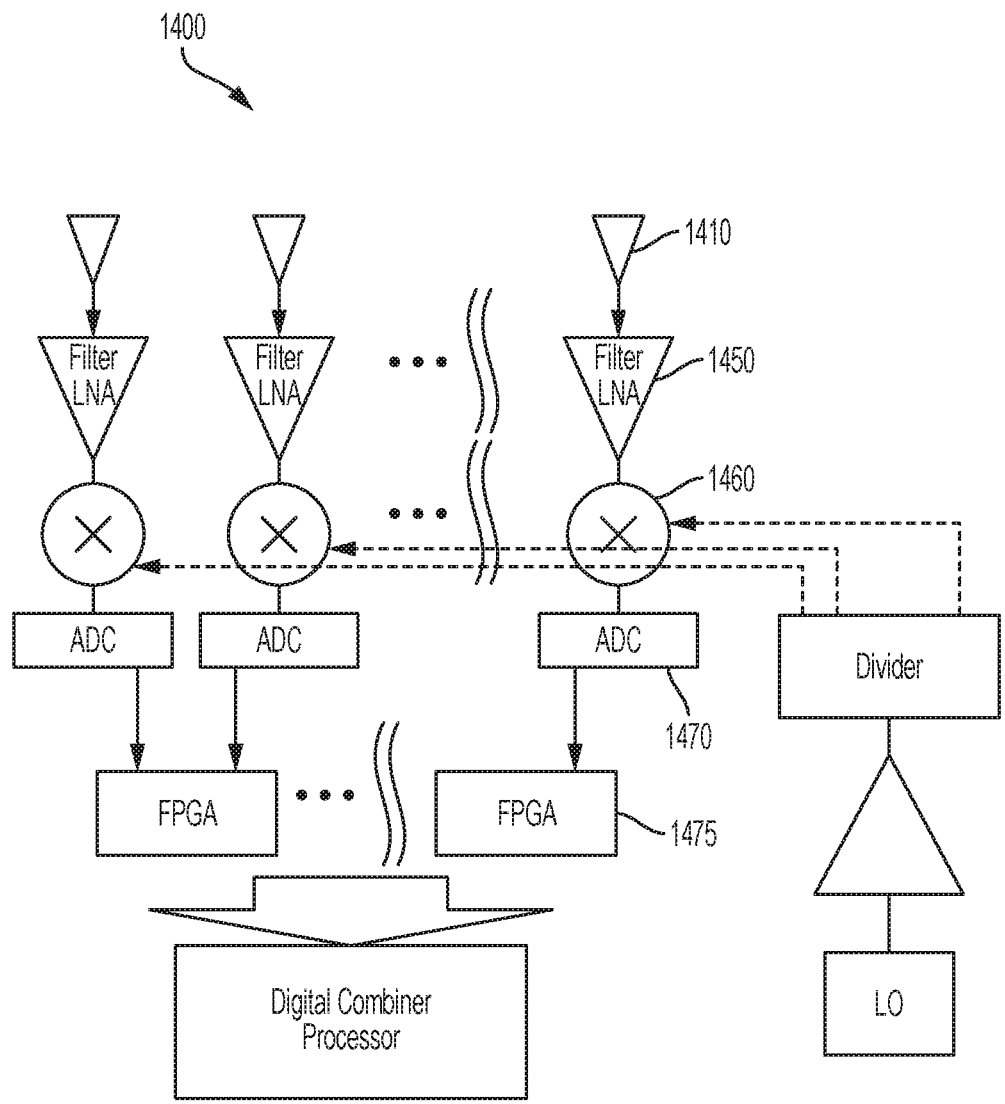
FIG. 14 depicts an exemplary configuration of a conventional Tightly Coupled Array.

FIG. 14 depicts an exemplary configuration of a conventional TCA 1400. As shown in FIG. 14, each sensor element 1410 includes its own filter and low noise amplifier (LNA) 1450, downconverter 1460, analog-to-digital converter 1470, and Field-Programmable Gate Array (FPGA) digital channel 1475. Each of these components is expensive and adds not only to the cost of a conventional TCA, but also the weight, size, complexity, and power consumption. These expenses are especially noticeable given the significant number of sensor elements in a conventional TCA. For example, a 6-inch by 6-inch conventional TCA might have 16 by 16 sensor elements, with 256 elements in total, and differently sized conventional TCAs may even have 512 elements or more.

The most expensive component in a typical conventional TCA system is a broadband phase shifter, which can cost from about 2,000 to 5,000 U.S. dollars. The inventor has recognized and appreciated that phase shifters, which are used to steer antenna array beams, also limit the bandwidth of the TCA to about 6:1. As mentioned in the previous paragraph, a conventional TCA requires an equal number of RF channels including phase shifters as the number of array elements, which can be significant.

The inventor has recognized and appreciated that the cost, weight, size, complexity, and power consumption of a DOA determination and electronic attack system may be greatly reduced using a single channel synthetic beam steering system, in accordance with some embodiments. Moreover, the inventor has recognized and appreciated that limitations of conventional systems and conventional TCAs, such as the bandwidth limitation discussed above, may be overcome using a single channel synthetic beam steering system, in accordance with some embodiments.

Examples of implementations are discussed below, but it should be appreciated that embodiments are not limited to operating in accordance with any of these illustrative embodiments, as other embodiments are possible. Further, it should be appreciated that while some embodiments are described as being implemented as part of a computer system that is a part of an aircraft, embodiments are not limited to being implemented with any particular form of vehicle or structure.

FIG. 1 shows an example system 100 for determining one or more directions of arrival of one or more coherent or incoherent signals with a single RF channel. System 100 may include antenna elements, such as antenna sensors 110, which may be configured to determine the coherent or incoherent DOA signal(s). According to some embodiments, system 100 may use low cost RF switches without phase shifters to steer a wide field of view (FOV) antenna array beams (wide beam) continuously in time such that the single RF channel will likely see the DOA signal(s) effectively being modulated by a planned pseudo-random switching pattern. The wide beam FOV may be assumed large enough to capture signals with all possible unknown DOAs within the FOV. After digital demodulations by compressive sensing, the unknown DOA(s) can initially be determined. For example, system 100 may also include a plurality of RF switches 120 configured to selectively activate one or more of the plurality of antenna elements 110. The inventor has recognized and appreciated that the RF switches 120 (which may be controlled by a switch driver 125) may be used instead of phase shifters to achieve such wide FOV beam steering. RF switches 120 can be simple switches that cost orders of magnitude less than phase shifters (e.g., a single RF switch 120 may cost only about 50 to 100 U.S. dollars each, compared to the 2,000 to 5,000 U.S. dollars of a single phase shifter).

The inventor has appreciated that a wide beam yields a lower array gain or vice versa, as FOV and array gain are inversely proportional. Because of the wider FOV, the array gain may be lower or the SNR may be lower. Thus, the initial wide FOV DOA estimates can be improved progressively by a similar process but with a higher array gain or a narrower FOV. According to some embodiments, a pre-determined pseudo-random switching pattern may be used for at least one progressive wide or narrow field of view for at least one direction of arrival estimation refinement.

The inventor has recognized and appreciated that a single channel synthetic beam system using the same low cost RF switches 120 is feasible for directional beam steering without phase shifters. Unlike the wide FOV beam, this directional beam steering may be for a much narrower beam. Assuming the DOA(s) has/have been determined, the directional beam can be steered to a sector centered at the specific DOA(s) with much narrower FOV. This directional beam steering can be introduced by another planned pseudo-random switching pattern. Similarly, these RF switches are selectively activated to more coherently utilize the aperture in such a way that near in-phase signals are included while near out-of-phase signals are excluded. Although some aperture efficiency loss may result from this exclusion, the overall system efficiency or loss may be comparable to the phase shifter beamsteering system when the phase shifter higher losses are accounted for. Alternatively or additionally, beamforming or beamsteering may be performed without a pseudo-random switching pattern, which may be similar to a normal phased array without phase shifters. Some embodiments lacking a pseudo-random switching pattern may be used for transmit or receive applications.

The inventor has recognized and appreciated that using RF switches 120 instead of phase shifters may be advantageous. This is because a single channel synthetic beamformer system using RF switches can reduce the weight, size, complexity, and power consumption relative to using phase shifters, and may prevent loss due to phase shifters as compared to the much lower RF switch loss. Moreover, the inventor has recognized and appreciated that using RF switches 120 may improve aperture efficiency, and thus both sensitivity performance and overall array gain. For example, if an emitter DOA is near boresight, the phase across the aperture may be nearly in-phase, and the synthetic beamformer gain may be near what can be achieved by the full aperture. In this case, the synthetic beamformer utilizes the entire antenna assembly aperture, as opposed to just the discrete sensor apertures, for enhancing the overall array gain.

If, on the other hand, the DOA is at the edge of some given scan limits, such as 60 degrees azimuth and −60 degrees elevation, the phase distribution with multiples of phase wraps at the highest frequency may be [−180° to 180°], uniformly distributed over the antenna elements 110. This may be the worst case synthetic beamformer gain in terms of the uniform phase distribution. In this case, the worst case synthetic beamformer gain at the scan angle limits may be analytically derived to be $1/\pi^2$, which is about −10 dB loss. This loss is primarily due to only having about ½ of the antenna elements contributing to the overall array gain. This is because the sensor elements having phases of +/−90 degrees from an offset phase may be approximately half of all antenna elements having phases of +/−180 degrees from the same offset phase. The theoretical gain loss of $1/\pi^2$ is based on summing half of the sensor elements' complex sinusoids with progressively increasing phases up to +/−90 degrees.

This −10 dB worst case penalty may be relaxed at lower frequency, due to relatively less phase wrapping. In such a case, the phase offset may help reduce the gain loss to about −5 dB instead of −10 dB by having more antenna elements contributing to the overall array gain. In other words, when the phase distribution at the lower frequency is not uniform across [−180° 180°], more antenna elements may have phases concentrated near certain phase bias value, and less antenna elements may have other phase values. As a result of this non-uniform phase distribution at lower frequency, the array gain can be further maximized through a search for the optimum phase offset, as shown in FIG. 11B.

According to some embodiments, array gain may be comparable to conventional TCA technology. Moreover, some embodiments may provide ultra-wide band (UWB) performance, utilizing the full aperture over a wide range of frequencies (e.g., 0.5 to 18 GHz). Some embodiments may provide other abilities of TCA technology, but without the drawbacks of conventional TCA technology or other conventional DOA systems. For example, some embodiments can estimate DOA for azimuth, elevation, and polarization parameters without conventional bandwidth limitations or a high number of interconnect cables. Additionally, some embodiments may provide significantly improved emitter characterization accuracy at super resolution and high SNR. Furthermore, some embodiments may achieve better DOA accuracy than conventional DOA systems even with a smaller antenna aperture than conventional systems.

According to some embodiments, system 100 may additionally include a radio frequency combiner 130 (which may be an analog combiner) configured to combine a plurality of RF signals from one or more selectively activated antenna elements of the antenna elements 110. The activated antenna elements may be those antenna elements 110 that are connected to the combiner 130 via their corresponding RF switches 120.

According to some embodiments, system 100 may include at least one RF channel and at least one processor configured to determine the one or more directions of arrival of the one or more coherent or incoherent signals. The processor may be a digital receiver processor, such as digital receiver processor 140. In some embodiments, processor 140 may control switch driver 125 and thereby control the RF switches 120.

According to some embodiments, system 100 may include a single RF channel, as shown in FIG. 1. The inventor has recognized and appreciated that the combiner 130 in use with RF switches 120 may avoid the many channels needed in a conventional TCA, thereby increasing the affordability of the system 100. The use of the combiner 130 with RF switches 120 also may allow the use of a single component of each type (e.g., one each of a filter and LNA 150, RF downconverter and intermediate frequency (IF) filter 160, and ADC 170) for the entire array. The inventor has recognized and appreciated that using a single component of each type with a conventional TCA would lose all the digital capabilities of the TCA, but that using compressive sensing beamforming according to some embodiments may prevent the loss of the digital capabilities. The inventor has also appreciated that using a single component of each type may greatly decrease the cost, weight, size, complexity, and power consumption of system 100.

According to some embodiments, compressive sensing beamforming may effectively replace the multiple channels that would otherwise exist downstream from the combiner 130. For example, compressive sensing may be used to parse the single channel into multiple digital channels by reconstructing, at the element level, where each digital signal is within the single channel.

According to some embodiments, processor 140 may perform the compressive sensing beamforming. Processor 140 may do so by executing an algorithm on a single channel that leaves the combiner 130. According to some embodiments, processor 140 may be configured to determine the one or more directions of arrival of the coherent or incoherent signal(s) using compressive sensing and the at least one RF channel.

According to some embodiments, system 100 may include a local oscillator (LO) 180. According to some embodiments, processor 140 may tune LO 180 to different frequencies (like tuning a car radio) as a receiver. Additionally, processor 140 may synchronize compressive sensing to the sample time used in ADC 170.

Figure 2:
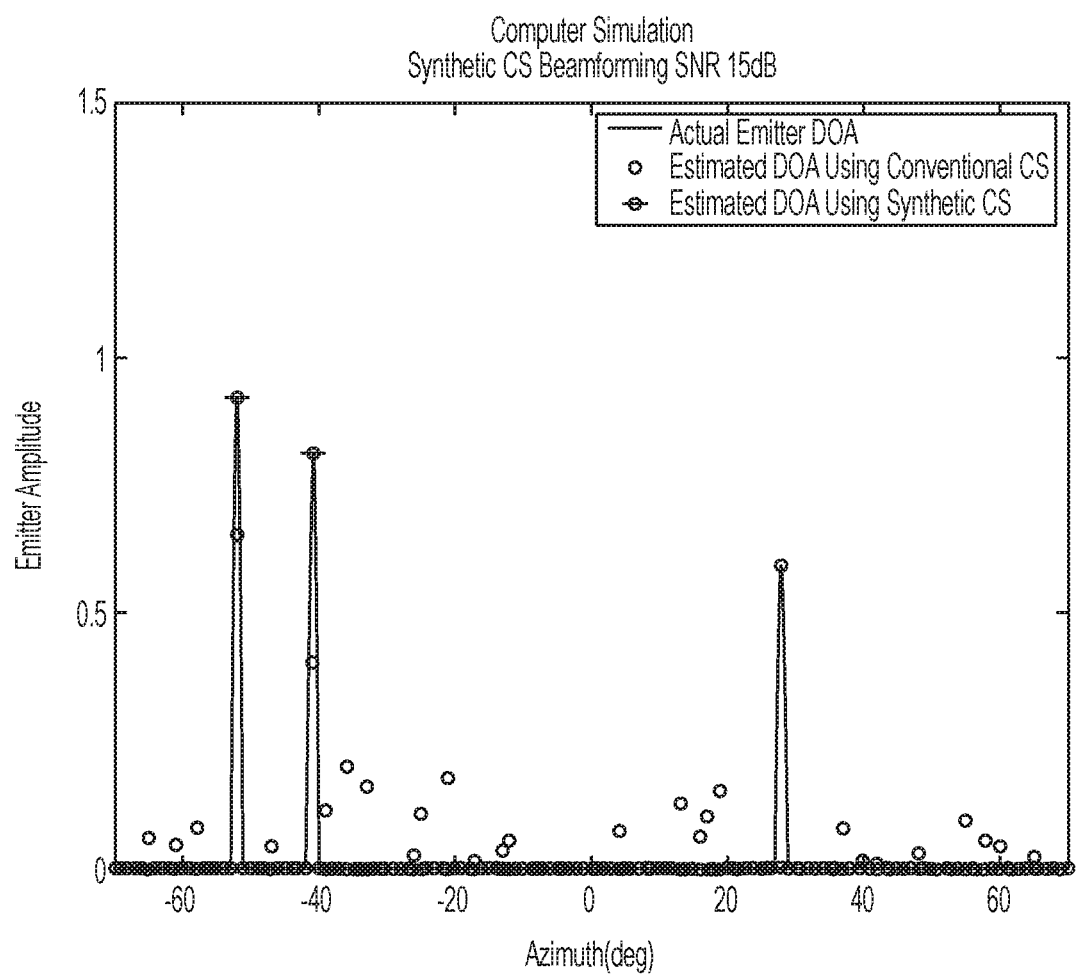
FIG. 2 depicts a graph of a comparison between results of an exemplary synthetic compressive sensing system and a conventional compressive sensing system, in accordance with some embodiments.

The inventor has recognized and appreciated that synthetic compressive sensing according to some embodiments may provide significantly improved DOA estimation accuracy than conventional compressive sensing. FIG. 2 depicts a graph of a comparison between results of an exemplary synthetic compressive sensing system and a conventional compressive sensing system, in accordance with some embodiments. The solid line (with three spikes) in FIG. 2 represents the actual emitter DOA, while the numerous circles represent the estimated DOA using conventional compressive sensing, and the three stricken-through circles represent the estimated DOA using synthetic compressive sensing according to some embodiments. As FIG. 2 shows, the conventional compressive sensing produces scattered estimates, while the synthetic compressive sensing may produce estimates that are very close to the actual emitter DOA.

According to some embodiments, system 100 may provide super-resolution estimates of DOA based on time sampled measurements on a single channel using techniques described herein.

Figure 3:
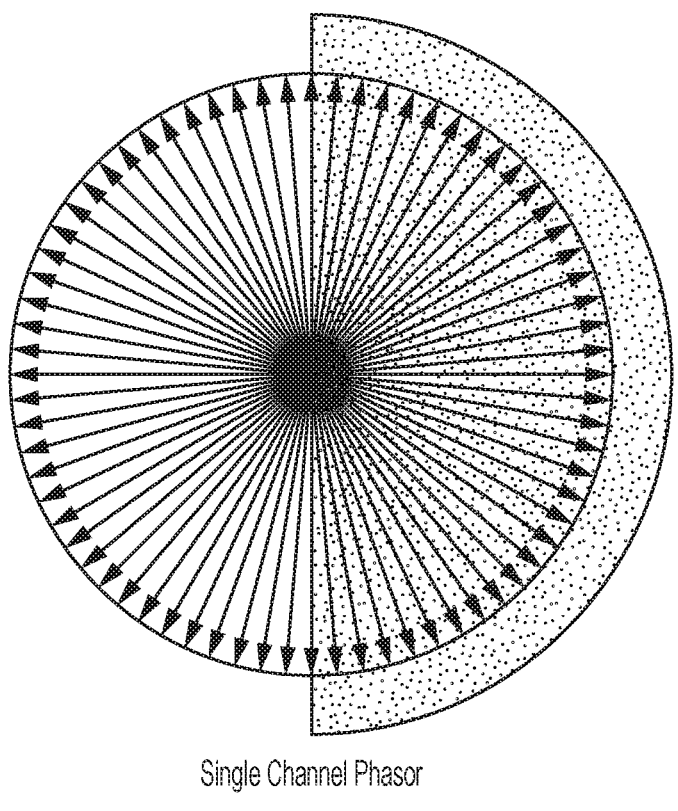
FIG. 3 depicts an exemplary single channel phasor for synthetic compressive sensing, in accordance with some embodiments.

According to some embodiments, system 100 may use a single channel phasor for synthetic compressive sensing. FIG. 3 depicts an exemplary single channel phasor, in accordance with some embodiments. The inventor has recognized and appreciated that using a single channel phasor may reduce the cost, complexity, and power consumption of system 100 by using half the phases of a conventional system. For example, in some embodiments a single channel phasor may use phases of $[-\pi/2\ \pi/2]$ rather than all phase $[-\pi\pi]$. In other words, half of the vectors shown in FIG. 2 may not need to be used.

According to some embodiments, system 100 may also include a built-in test (BIT) 190. BIT 190 may be used to verify appropriate operation of system 100.

Figure 4:
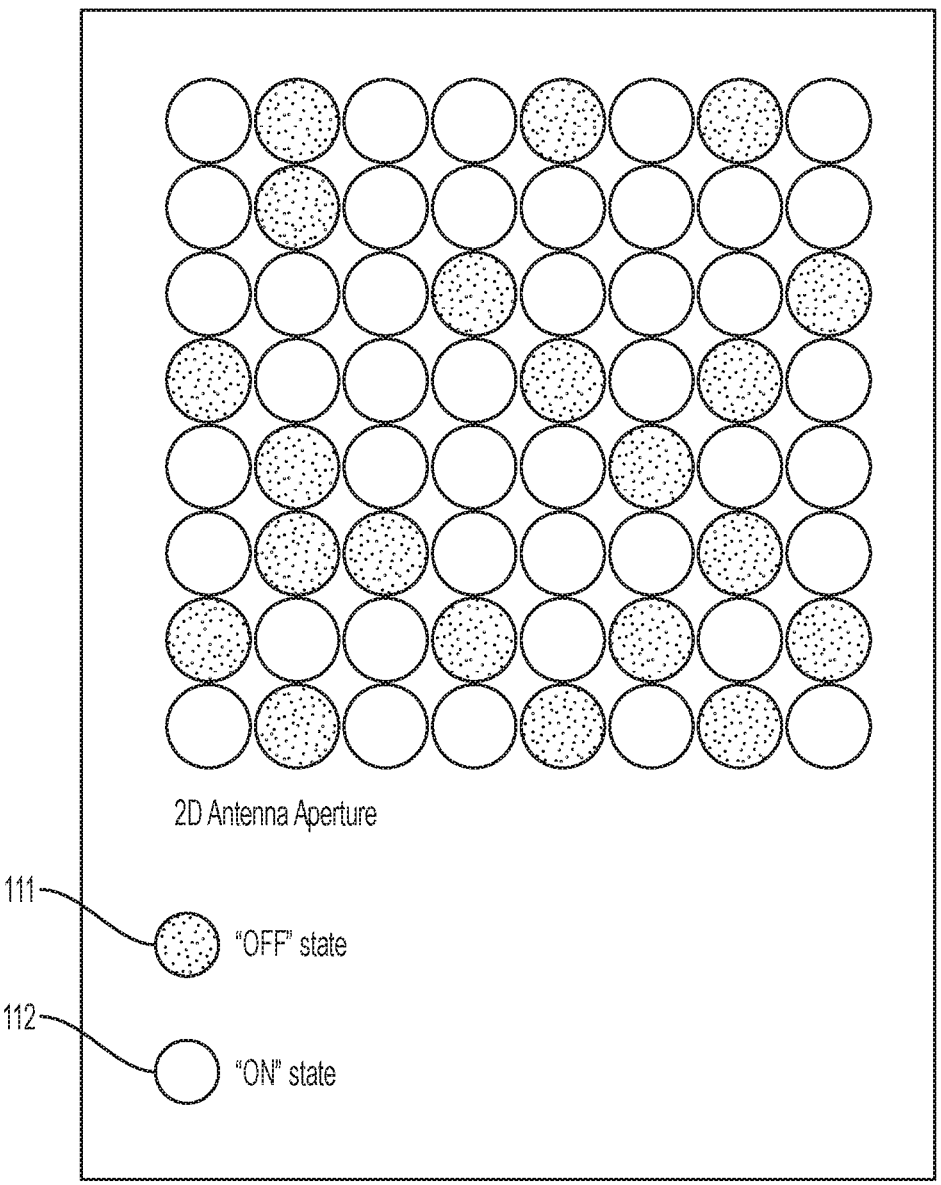
FIG. 4 depicts an example antenna aperture in accordance with some embodiments.

According to some embodiments, the RF switches 120 may be configured to selectively activate the one or more of the plurality of antenna elements 110 based on a predetermined pseudo-random switching/modulation pattern (e.g., the modulation may be time response modulation w(t)). In some embodiments, this switching pattern may be transmitted from processor 140 to switch driver 125 and implemented by switch driver 125 in the RF switches 120. FIG. 4 depicts an example antenna aperture at a given time in accordance with some embodiments, with some antenna elements 110 in an "off" state (unactivated) 111 and some in an "on" state (activated) 112. FIG. 5, at top, depicts an example of a pseudo-random switching pattern, in accordance with some embodiments. FIG. 5, at bottom, also depicts an exemplary channel system response timing diagram, in accordance with some embodiments.

According to some embodiments, antenna elements 110 may be activated and deactivated in a pattern that provides a FOV than conventional DOA systems. Additionally, wider FOV beam steering convergence may provide iterative DOA improvement. Alternatively or additionally, the pattern may provide an isometry property (full rank isometry matrix [A], as shown in FIG. 6C) for some embodiments. In some embodiments, full aperture gain may be possible after beam convergence.

According to some embodiments, the one or more selectively activated antenna elements of the antenna elements 110 may be connected to the radio frequency combiner 130. According to some embodiments, some of the antenna elements 110 may be unactivated at any given time, as shown in FIGS. 2 and 3. These unactivated antenna element(s) 111 may be connected to an internal load 121 of their corresponding RF switches 120. Additionally, the RF combiner 130 may be connected to an internal load 122 of the corresponding RF switches 120. The inventor has recognized and appreciated that maintaining a connection between an unactivated antenna element 111 (not connected to the RF combiner 130) and an internal load 121 may ensure that the TCA of the system 100 maintains stable scan impedance over frequency and RF switch state patterns over time.

According to some embodiments, the antenna elements 110 may have phases grouped by the plurality of RF switches 120 within 90 degrees of an allowable offset phase, which can be compensated by one or more calibrations. The inventor has recognized and appreciated that activating antenna elements 110 with phases within 90 degrees of an allowable offset phase may improve the SNR for DOA determination.

According to some embodiments, the antenna elements 110 may be arranged in an array of at least one dimension, such as is shown in FIG. 1. Alternatively, the antenna elements 110 may be arranged in two (as shown in FIG. 4) or three dimensions. The inventor has recognized and appreciated that in some embodiments, system 100 may essentially enhance a gain of the array of antenna elements 110 by utilizing area of the array outside the antenna elements 110 themselves. As discussed above, FIG. 12 provides a comparative example of an exemplary conventional discrete sensor antenna assembly with significant unutilized area 1240.

According to some embodiments, system 100 may essentially enhance the gain of the array of antenna element 110 by having phases of the one or more selectively activated antenna elements 112 nominally in phase within 90 degrees at a given beam steering angle. This phase grouping technique can easily be applied to the same embodiment for a normal beam forming (static case) or beam steering (dynamic case) to enhance an antenna array gain for transmit or receive applications. For example, in some applications, beam angle is commanded to a specific direction or an antenna array beam can be scanned in a certain sector, this embodiment is readily configurable for such normal array beamforming functions.

According to some embodiments, initially, the co-channel interference or multi-path DOAs may be unknown. As such, some embodiments may be configured to have a wide beam with a reduced array gain of about 8 dBi to cover +/−60 degree azimuths and +/−60 degree elevations as an example. This angular coverage may depends on specific applications. There may be many RF switch 120 states corresponding to this wide beam configuration. Of these possible states, 32 states as an example may be predetermined as the initial switch pattern, which may repeat in $T_{period}$ time ($T_{period}$ may equal the number of states multiplied by the switch time duration). The 32 RF switch 120 times may be synchronized with the processor's 140 time sample measurements, which may be used for the compressive sensing DOA estimation.

According to some embodiments, the choice for the number of the initial switch states may be a tradeoff between the compressive sensing DOA estimation performance (e.g., the maximum number of unknown DOAs to be estimated simultaneously at a given SNR) and the anticipated emitter signal bandwidth to be handled properly without aliasing. The larger the number of switch states being used, the better the DOA estimation, but the lower the maximum signal bandwidth that can be handled.

As shown in FIG. 1, processor 140 can dwell on a specific tuned IF frequency one at a time, as may be set by a LO heterodyne scheme. The RF switches 120 may be turned "On" or "Off" (activated or deactivated) in time steps from $t_1$ to $t_M$, according to the top of FIG. 5, for the initial wide beam configuration. The sensor elements from $W_1$ to $W_{Nelement}$ may be either connected or not connected to the combiner 130. When not connected to the combiner 130, the antenna elements 111 are still connected to the switch's internal terminations, as discussed above.

The equations shown in FIG. 6 include a multiplication in the time domain, which means a corresponding convolution of H(f) and S(f) in the frequency domain. As shown at the bottom of FIG. 5, the magnitude of h(t) may be a periodic waveform that has minimum pulse width of $T_{sw}$, the switch time duration, with a period of $T_{period}$. Therefore, H(f) may have spectral lines with spacing equals to $1/T_{period}$, and the spectrum maybe approximately band-limited to $1/T_{sw}$.

Figure 7A:
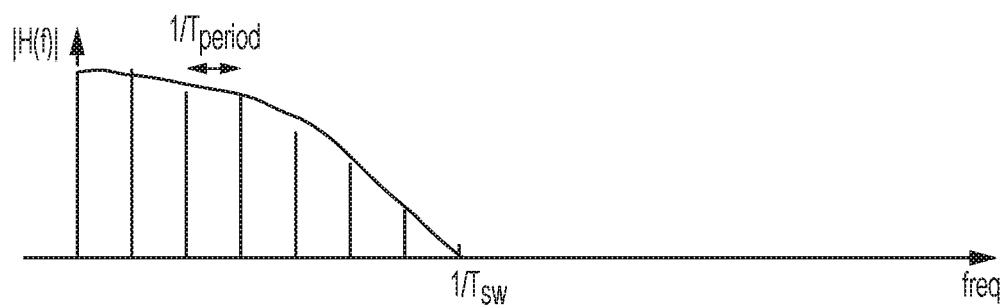
FIGS. 7A and 7B depict a channel system response frequency spectrum and an emitter signal frequency spectrum, respectively, in accordance with some embodiments.
Figure 7B:
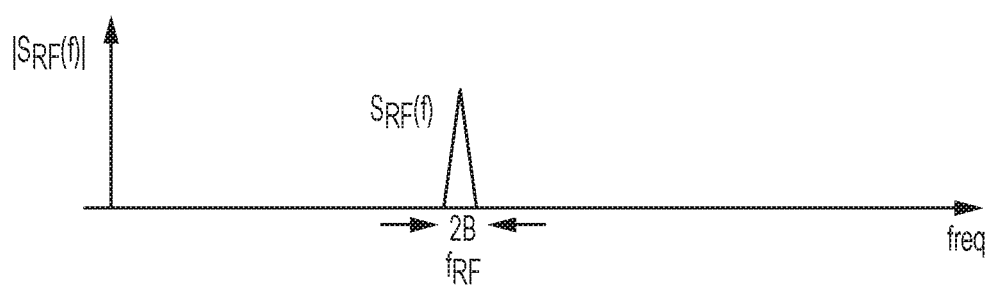
Figure 8A:
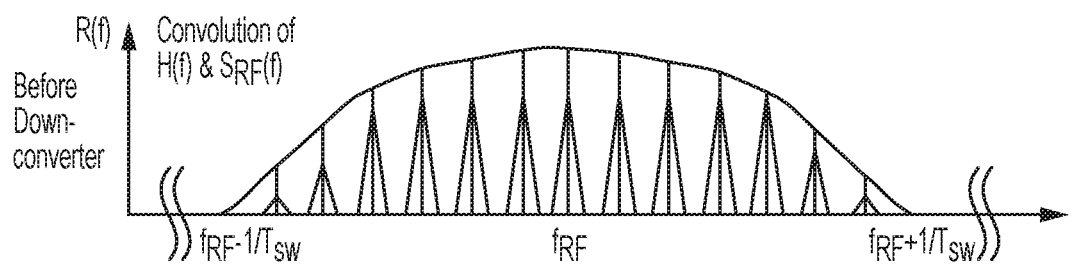
FIGS. 8A and 8B depict a diagram of an exemplary convolution of H(f) and an emitter signal frequency spectrum, in accordance with some embodiments.
Figure 8B:
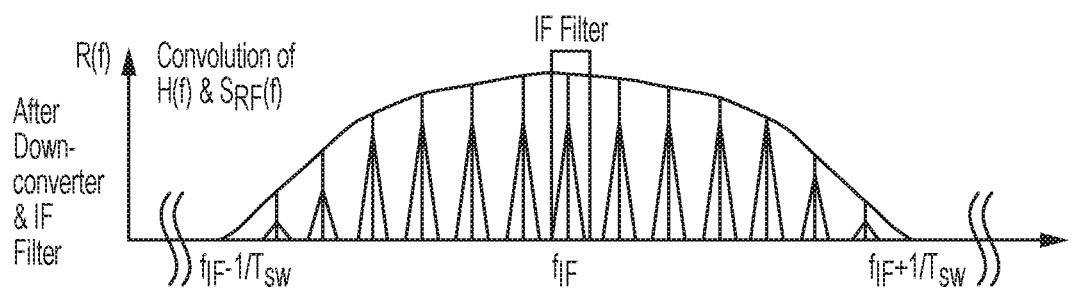

As shown in FIG. 7B, S(f) may be a band limited signal with a carrier frequency centered at $f_{RF}$. After the convolution, the R(f) before the down converter may have frequency spectrum as shown in FIG. 8A. If the $1/T_{period}$ is greater than 2B, then the signal baseband spectrum may not be distorted (i.e. no aliasing). As a result, R(f) after the down converter and IF filter (as shown in FIG. 8B) may have the undistorted S(f) baseband signal centered at the IF frequency.

Assuming processor 140 is doing the digital I/Q demodulation to handle the complex signal digital processing, a number of measurement (e.g., 32: $r(t_1)$, $r(t_2)$, ... $r(t_M)$) can be used for compressive sensing reconstruction in some embodiments.

According to some embodiments, the compressive sensing DOA technique may be based on the formulation of r(t) equaling the product of one matrix with some unknown emitters' signal strengths (e.g., $f_1$, $f_2$, ... $f_{Nangle}$) plus the Additive White Gaussian Noise (AWGN) vector, as shown in FIG. 6C. Imposing the assumed sparsity for the few limited number of emitter DOAs, the f vector may be limited to a few non-zero values. Using some compressive sensing algorithms, f can be recovered for a given set of measurements. The index positions of f that have non-zero values may determine the unknown DOAs. The amplitudes of the non-zero value f (complex I/Q values in the digital receiver processing) may determine the relative signal strength and phase or time delay. These amplitudes can be used to separate the main direction path signal from the undesired multi-path signals. Hence, system DOA estimation performance may be significantly enhanced. Some embodiments may be immune to multi-path errors.

According to some embodiments, in order to widen the $1/T_{period}$ to avoid signal aliasing, the number M should be kept to a minimum. For example, if s(f) has 10 MHz baseband bandwidth such as a pulse train with pulse width on the order of 100 nanoseconds, the switching duration time needs to be 100 nanoseconds/32, which is 3.125 nanoseconds, which appears to be achievable in the industry.

As discussed above in part, FIG. 2 shows the recovered DOA of 3 multi-path coherent signals arriving at the array, according to some embodiments. The actual emitters' DOA are indicated by the 3 solid spikes. The numerous circles represent the estimated DOA using conventional L1-norm Basis Pursuit compressive sensing. As can be seen, one DOA at around 28 degree is completely missed given the 15 dB SNR. The three stricken-through circles represent the estimated DOA using synthetic compressive sensing, showing significantly more stable and better DOA performance.

According to some embodiments, once the initial DOA(s) are determined, a new set of RF switch 120 states can be used with more array gain points to the initially estimated DOA angles. Whether one at a time or only the dominant direct path DOA is used depends on specific applications. In some embodiments, repeating the compressive sensing recovery process may improve the DOA estimation with much higher SNR. For example, recovered DOA can be iteratively used for high gain beam steering.

Figure 9:
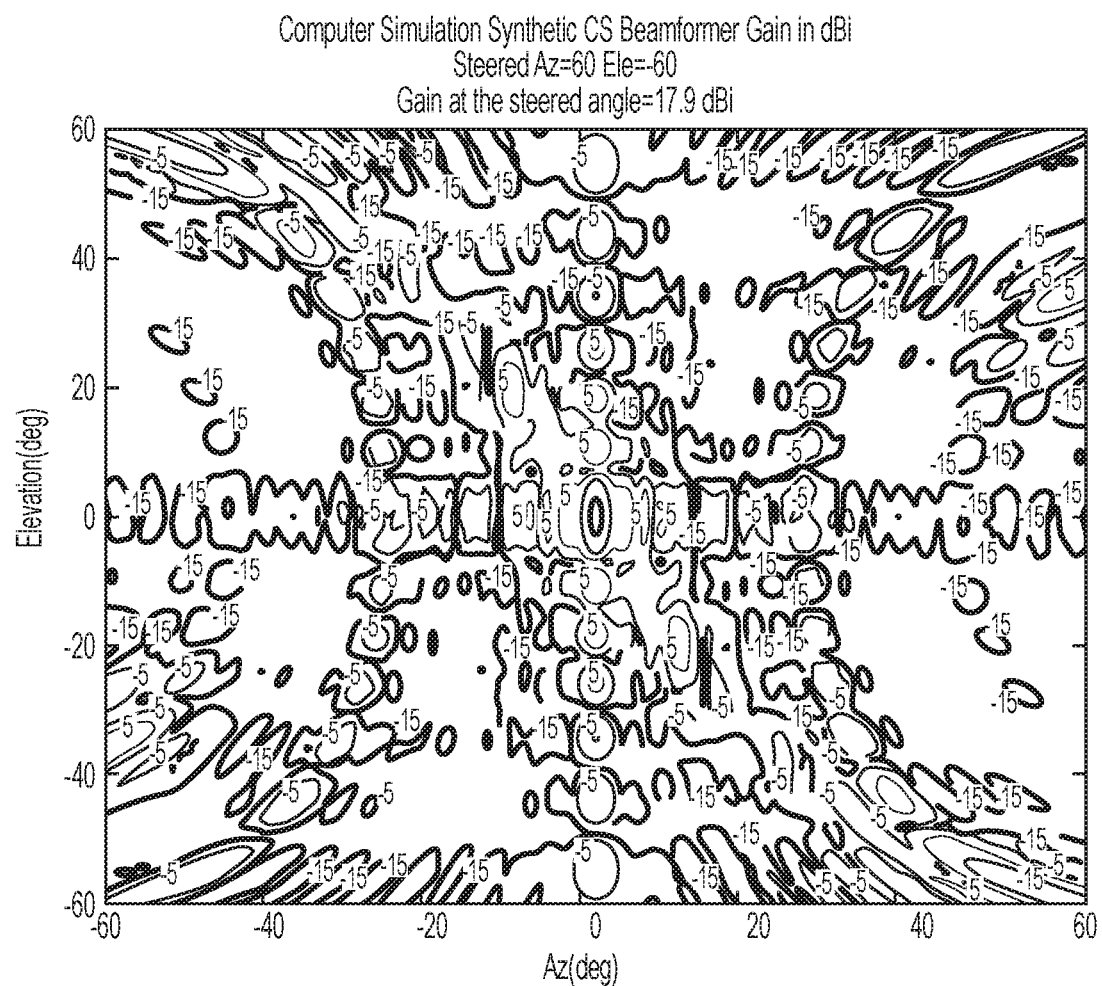
FIG. 9 depicts a graph of an additional exemplary synthetic compressive sensing beamformer gain, in accordance with some embodiments.

According to some embodiments, the synthetic beamformer array gain at $f_H$ with the steered azimuth at 60 degrees and steered elevation at −60 degrees (worst case) may have a theoretical gain of +23.5 dBi, which may include the cos(60)×cos(60) aperture scan loss as shown in FIG. 9. By comparison, the synthetic beamformer in some embodiments may have 25 dB improvement over the conventional spiral antenna gain of −1 dBi (+5 dBi peak gain—6 dB projection loss), which is very significant for improving the system sensitivity performance.

Figure 10:
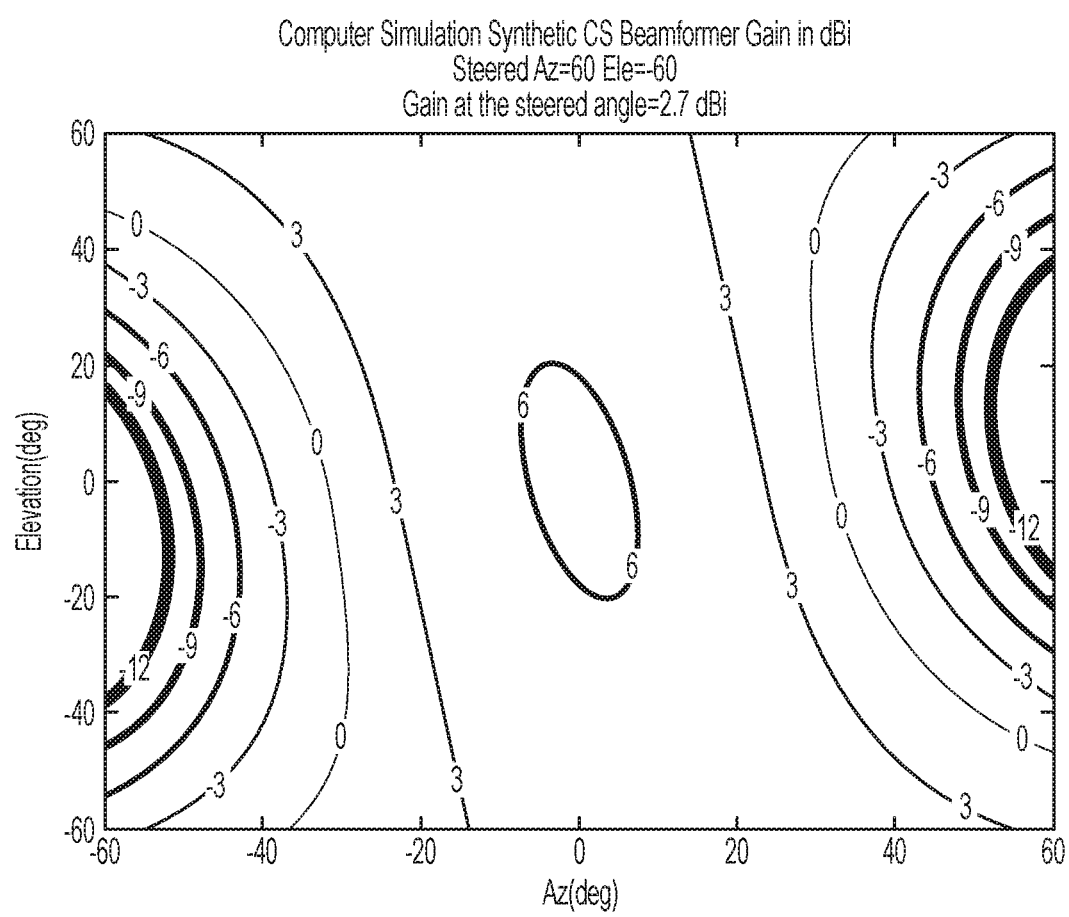
FIG. 10 depicts a graph of an additional exemplary synthetic compressive sensing beamformer gain, in accordance with some embodiments.
Figure 11A:
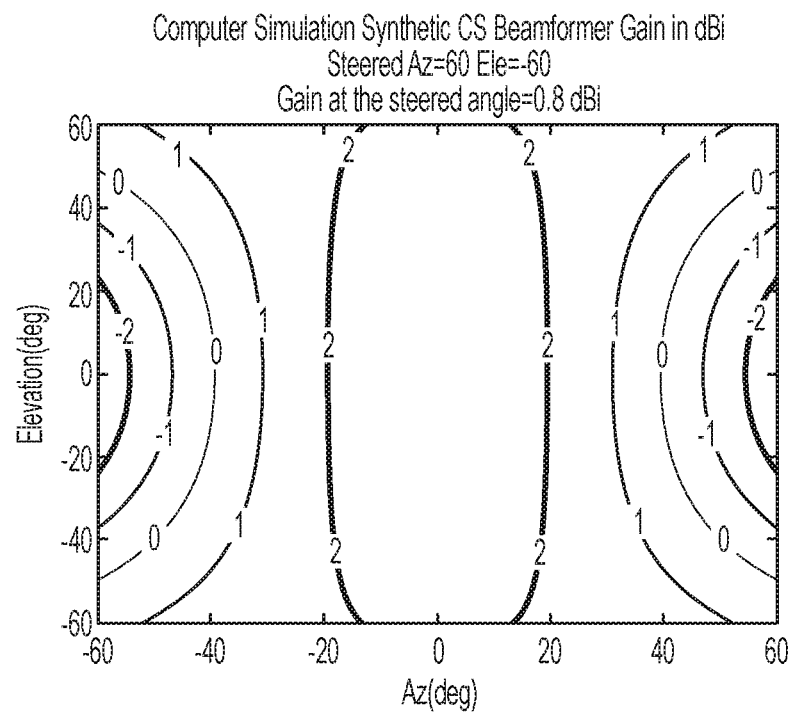
FIGS. 11A and 11B depict graphs of a further exemplary synthetic compressive sensing beamformer gain and of an exemplary gain optimization by phase offset, respectively, in accordance with some embodiments.
Figure 11B:
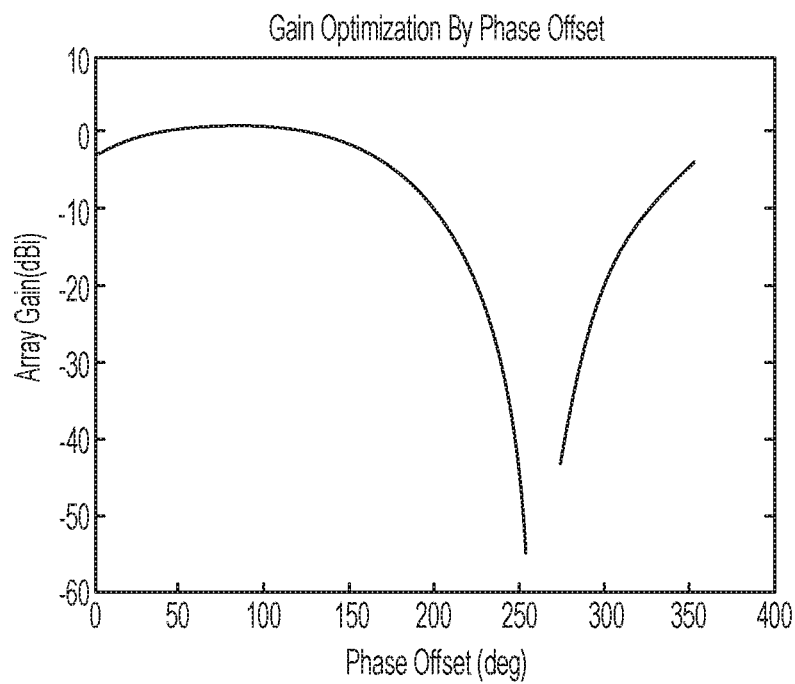

FIGS. 10 and 11A-B show a similar array gain of +3 dBi at $f_H/18$ and 0.9 dBi at $f_H/36$ at the same steered angle according to some embodiments. The gain improvement may be 10 dB at $f_H/18$ and also 10 dB at $f_H/36$ respectively. In addition, the DOA performance using some embodiments with compressive sensing may be as good as the array calibration resolution, which in this case is 1 degree across the full frequency band. On the contrary, the DOA performance using a conventional phase interferometer usually suffers from limited electrical spacing at low frequency.

According to some embodiments, system 100 may be adapted or used for electronic attack. The inventor has recognized and appreciated that for electronic attack, low power for each antenna element is desirable, but high power is desirable when the antenna elements are combined. The inventor also recognized that it is important to create a highly directional beam, not a broad beam, which could allow a hostile party to locate the emitter. A desirable beam width is only about 5 degrees. In some embodiments, compressive sensing may be used to determine the angle to use for electronic attack. Given that angle, techniques described herein may be used to form and direct a beam precisely where it should go.

Figure 15:
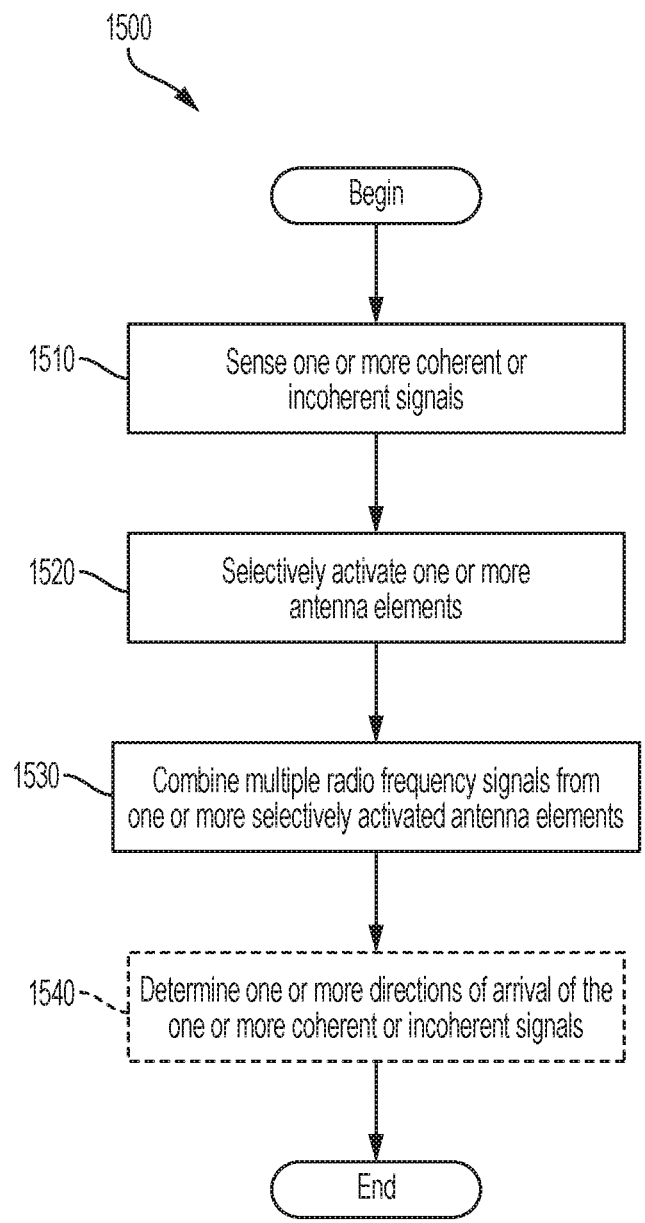
FIG. 15 depicts a flowchart of an exemplary process that may be implemented in some embodiments.

FIG. 15 illustrates a flowchart of an exemplary process 1500 that may be used in some embodiments. The process 1500 begins at stage 1510. At stage 1510, system 100 may determine, using a plurality of antenna elements 110, one or more coherent or incoherent signals. For example, the antenna element 110 may receive signal(s) from one or more objects, such as hostile aircraft, as described above. The process 1500 may then proceed to stage 1520.

At stage 1520, system 100 may selectively activate, using a plurality of radio frequency switches 120, one or more of the antenna elements 110. The process 1500 may then proceed to stage 1530.

At stage 1530, system 100 may combine, using a radio frequency combiner such as combiner 130, a plurality of radio frequency signals from one or more selectively activated antenna elements 112, as described above. The process 1500 may then proceed to stage 1540.

At stage 1540, system 100 may determine the one or more directions of arrival of the one or more coherent or incoherent signals, as described above. The process 1500 may then end. The process 1500 may alternatively be repeated for any number of additional signals until system 100 is deactivated.

Techniques operating according to the principles described herein may be implemented in any suitable manner. Included in the discussion above is a flow chart showing the steps and acts of various processes used to determine the DOA of signal(s). The processing and decision blocks of the flow chart(s) above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow chart(s) included herein do not depict the syntax or operation of any particular circuit or of any particular programming language or type of programming language. Rather, the flow chart(s) illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

In some, but not all, implementations in which the techniques may be embodied as computer-executable instructions, these instructions may be executed on one or more suitable computing device(s) operating in any suitable computer system, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device (co-located or geographically distributed) dedicated to executing the techniques described herein, one or more Field-Programmable Gate Arrays (FPGAs) for carrying out the techniques described herein, or any other suitable system.

Figure 16:
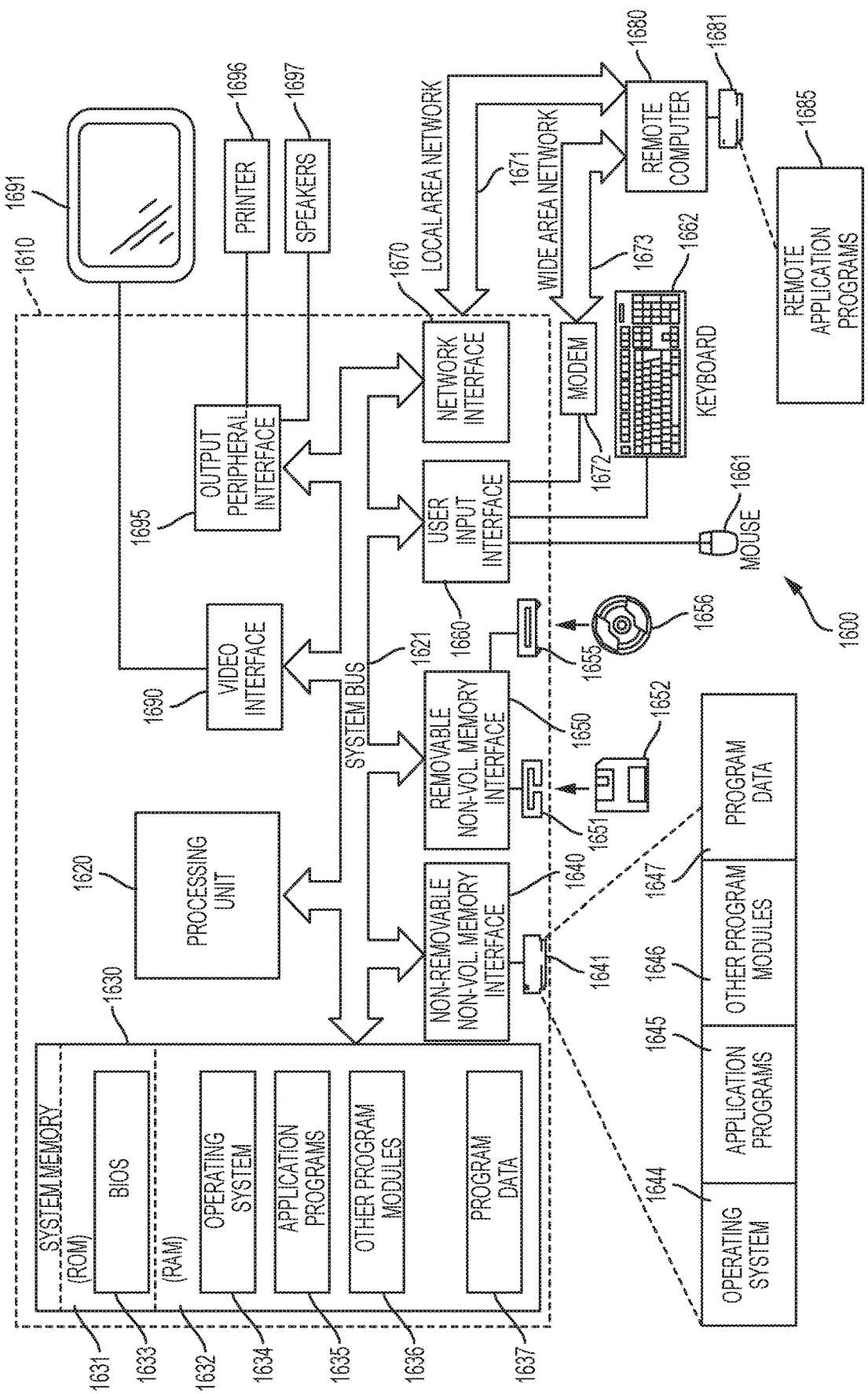
FIG. 16 depicts a block diagram of a computing device with which some embodiments may operate.

FIG. 16 illustrates an example of a suitable computing system environment 1600 on which some embodiments may operate. The computing system environment 1600 is only one example of a suitable computing environment and is not intended to suggest any limitation as to the scope of use or functionality of the application. Neither should the computing environment 1600 be interpreted as having any dependency or requirement relating to any one or combination of components illustrated in the exemplary operating environment 1600.

Some embodiments of the application are operational with numerous special purpose or multi-purpose computing system environments or configurations. Examples of well-known computing systems, environments, and/or configurations that may be suitable include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The application may also be practiced in distributed computing environments where tasks are performed by remote processing devices that are linked through a communications network. In a distributed computing environment, program modules may be located in both local and remote computer storage media including memory storage devices.

With reference to FIG. 16, an exemplary system for implementing some embodiments of the application includes a computing device in the form of a computer 1610. Computer 1610, with programming or other modification to perform functions as described herein may be used to implement a system for determining the DOA of signal(s). Alternatively or additionally, device 1610, rather than being dedicated to a particular task, may be a computer that would, in normal operation, store or retrieve information from a storage device. In that scenario, computer 1610 may be a processor 140 that determines the DOA of signal(s) using techniques as described herein.

Components of computer 1610 may include, but are not limited to, a processing unit 1620, a system memory 1630, and a system bus 1621 that couples various system components including the system memory to the processing unit 1620. The system bus 1621 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 1610 typically includes a variety of computer readable media. Computer readable media can be any available media that can be accessed by computer 1610 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 1610. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of the any of the above should also be included within the scope of computer readable media.

The system memory 1630 includes computer storage media in the form of volatile and/or nonvolatile memory such as read only memory (ROM) 1631 and random access memory (RAM) 1632. A basic input/output system 1633 (BIOS), containing the basic routines that help to transfer information between elements within computer 1610, such as during start-up, is typically stored in ROM 1631. RAM 1632 typically contains data and/or program modules that are immediately accessible to and/or presently being operated on by processing unit 1620. By way of example, and not limitation, FIG. 16 illustrates operating system 1634, application programs 1635, other program modules 1636, and program data 1637.

The computer 1610 may also include other removable/non-removable, volatile/nonvolatile computer storage media. By way of example only, FIG. 16 illustrates a hard disk drive 1641 that reads from or writes to non-removable, nonvolatile magnetic media, a magnetic disk drive 1651 that reads from or writes to a removable, nonvolatile magnetic disk 1652, and an optical disk drive 1655 that reads from or writes to a removable, nonvolatile optical disk 1656 such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 1641 is typically connected to the system bus 1621 through an non-removable memory interface such as interface 1640, and magnetic disk drive 1651 and optical disk drive 1655 are typically connected to the system bus 1621 by a removable memory interface, such as interface 1650.

The drives and their associated computer storage media discussed above and illustrated in FIG. 16, provide storage of computer readable instructions, data structures, program modules and other data for the computer 1610. In FIG. 16, for example, hard disk drive 1641 is illustrated as storing operating system 1644, application programs 1645, other program modules 1646, and program data 1647. Note that these components can either be the same as or different from operating system 1634, application programs 1635, other program modules 1636, and program data 1637. Operating system 1644, application programs 1645, other program modules 1646, and program data 1647 are given different numbers here to illustrate that, at a minimum, they are different copies. A user may enter commands and information into the computer 1610 through input devices such as a keyboard 1662 and pointing device 1661, commonly referred to as a mouse, trackball, or touch pad. Other input devices (not shown) may include a microphone, joystick, game pad, satellite dish, scanner, or the like. These and other input devices are often connected to the processing unit 1620 through a user input interface 1660 that is coupled to the system bus, but may be connected by other interface and bus structures, such as a parallel port, game port or a universal serial bus (USB). A monitor 1691 or other type of display device is also connected to the system bus 1621 via an interface, such as a video interface 1690. In addition to the monitor, computers may also include other peripheral output devices such as speakers 1697 and printer 1696, which may be connected through a output peripheral interface 1695.

The computer 1610 may operate in a networked environment using logical connections to one or more remote computers, such as a remote computer 1680. The remote computer 1680 may be a personal computer, a server, a router, a network PC, a peer device, or other common network node, and typically includes many or all of the elements described above relative to the computer 1610, although only a memory storage device 1681 has been illustrated in FIG. 16. The logical connections depicted in FIG. 16 include a local area network (LAN) 1671 and a wide area network (WAN) 1673, but may also include other networks. Such networking environments are commonplace in offices, enterprise-wide computer networks, intranets, and the Internet.

When used in a LAN networking environment, the computer 1610 is connected to the LAN 1671 through a network interface or adapter 1670. When used in a WAN networking environment, the computer 1610 typically includes a modem 1672 or other means for establishing communications over the WAN 1673, such as the Internet. The modem 1672, which may be internal or external, may be connected to the system bus 1621 via the user input interface 1660, or other appropriate mechanism. In a networked environment, program modules depicted relative to the computer 1610, or portions thereof, may be stored in the remote memory storage device. By way of example, and not limitation, FIG. 16 illustrates remote application programs 1685 as residing on memory device 1681. It will be appreciated that the network connections shown are exemplary and other means of establishing a communications link between the computers may be used.

Having thus described several aspects of at least one embodiment of this application, it is to be appreciated that various alterations, modifications, and improvements will readily occur to those skilled in the art.

Such alterations, modifications, and improvements are intended to be part of this disclosure, and are intended to be within the spirit and scope of the application. Further, though advantages of the present application are indicated, it should be appreciated that not every embodiment will include every described advantage. Some embodiments may not implement any features described as advantageous herein and in some instances. Accordingly, the foregoing description and drawings are by way of example only.

The above-described embodiments can be implemented in any of numerous ways. For example, the embodiments may be implemented using hardware, software, or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom, or custom. As a specific example, some commercially available microprocessors have multiple cores such that one or a subset of those cores may constitute a processor. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks, or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the application may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the application discussed above. As is apparent from the foregoing examples, a computer readable storage medium may retain information for a sufficient time to provide computer-executable instructions in a non-transitory form.

Tangible storage media have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Such a computer readable storage medium or media can be transportable, such that the program or programs stored thereon can be loaded onto one or more different computers or other processors to implement various aspects of the present application as discussed above. As used herein, the term "computer-readable storage medium" encompasses only a computer-readable medium that can be considered to be a manufacture (i.e., article of manufacture) or a machine. Alternatively or additionally, the application may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present application as discussed above. Additionally, it should be appreciated that according to one aspect of this embodiment, one or more computer programs that when executed perform methods of the present application need not reside on a single computer or processor, but may be distributed in a modular fashion amongst a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags, or other mechanisms that establish relationship between data elements.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

The invention claimed is:

1. An apparatus for determining one or more directions of arrival of one or more coherent or incoherent signals with a single radio frequency channel, the apparatus comprising:
   a plurality of antenna elements configured to determine the one or more coherent or incoherent signals;
   a plurality of radio frequency switches configured to selectively activate one or more of the plurality of antenna elements based on a pre-determined pseudo-random switching pattern; and
   a radio frequency combiner configured to combine a plurality of radio frequency signals from one or more selectively activated antenna elements of the plurality of antenna elements.

2. The apparatus of claim 1, further comprising:
   at least one radio frequency channel; and
   at least one processor configured to determine the one or more directions of arrival of the one or more coherent or incoherent signals.

3. The apparatus of claim 2, wherein the at least one processor is configured to determine the one or more directions of arrival of the one or more coherent or incoherent signals using compressive sensing and the at least one radio frequency channel.

4. The apparatus of claim 1, wherein the one or more selectively activated antenna elements of the plurality of antenna elements are connected to the radio frequency combiner.

5. The apparatus of claim 1, wherein each unactivated antenna element of one or more unactivated antenna elements of the plurality of antenna elements is connected to an internal load of a radio frequency switch of the plurality of radio frequency switches.

6. The apparatus of claim 1, wherein the plurality of antenna elements have phases grouped by the plurality of radio frequency switches within 90 degrees of an allowable offset phase, which can be compensated by one or more calibrations.

7. The apparatus of claim 1, wherein:
   the plurality of antenna elements are arranged in an array of at least one dimension; and
   the apparatus is configured to essentially enhance a gain of the array by utilizing area of the array outside the plurality of antenna elements.

8. The apparatus of claim 7, wherein:
   the plurality of antenna elements are arranged in an array of at least two dimensions; and
   the apparatus is configured to essentially enhance the gain of the array by having phases of the one or more selectively activated antenna elements of the plurality of antenna elements nominally in phase within 90 degrees at a given beam steering angle.

9. A method for determining one or more directions of arrival of one or more coherent or incoherent signals with a single radio frequency channel, the method comprising:
   sensing, using a plurality of antenna elements, the one or more coherent or incoherent signals;
   selectively activating, using a plurality of radio frequency switches, one or more of the plurality of antenna elements based on a pre-determined pseudo-random switching pattern; and
   combining, using a radio frequency combiner, a plurality of radio frequency signals from one or more selectively activated antenna elements of the plurality of antenna elements.

10. The method of claim 9, further comprising:
    beamforming or beamsteering without a pseudo-random switching pattern.

11. The method of claim 9, further comprising:
    determining the one or more directions of arrival of the one or more coherent or incoherent signals.

12. The method of claim 9, further comprising:
    determining the one or more directions of arrival of the one or more coherent or incoherent signals using compressive sensing and at least one radio frequency channel.

13. The method of claim 9, further comprising:
    using the pre-determined pseudo-random switching pattern for at least one progressive wide or narrow field of view for at least one direction of arrival estimation refinement.

14. The method of claim 9, further comprising:
    compensating, by one or more calibrations, an allowable offset phase, wherein phases of the plurality of antenna elements are grouped by the plurality of radio frequency switches within 90 degrees of the allowable offset phase.

15. The method of claim 9, further comprising:
    essentially enhancing a gain of the array by utilizing area of the array outside the plurality of antenna elements, the plurality of antenna elements being arranged in an array of at least one dimension.

16. The method of claim 9, further comprising:
    essentially enhancing the gain of the array by having phases of the one or more selectively activated antenna elements of the plurality of antenna elements nominally in phase within 90 degrees at a given beam steering angle, the plurality of antenna elements being arranged in an array of at least two dimensions.

17. At least one non-transitory computer-readable storage medium encoded with computer-executable instructions that, when executed by a computer, cause the computer to carry out a method for determining one or more directions of arrival of one or more coherent or incoherent signals with a single radio frequency channel, the method comprising:
    sensing, using a plurality of antenna elements, the one or more coherent or incoherent signals;
    selectively activating, using a plurality of radio frequency switches, one or more of the plurality of antenna elements based on a pre-determined pseudo-random switching pattern; and
    combining, using a radio frequency combiner, a plurality of radio frequency signals from one or more selectively activated antenna elements of the plurality of antenna elements.

18. The at least one non-transitory computer-readable storage medium of claim 17, further comprising:
    determining the one or more directions of arrival of the one or more coherent or incoherent signals.

* * * * *